(12) United States Patent
Sinha et al.

(10) Patent No.: US 9,171,936 B2
(45) Date of Patent: Oct. 27, 2015

(54) BARRIER REGION UNDERLYING SOURCE/DRAIN REGIONS FOR DUAL-BIT MEMORY DEVICES

(75) Inventors: Shankar Sinha, Redwood Shores, CA (US); Yi He, Fremont, CA (US); Zhizheng Liu, San Jose, CA (US); Ming-Sang Kwan, San Leandro, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 2142 days.

(21) Appl. No.: 11/634,777

(22) Filed: Dec. 6, 2006

(65) Prior Publication Data

US 2008/0135902 A1    Jun. 12, 2008

(51) Int. Cl.
| | | |
|---|---|---|
| H01L 29/66 | (2006.01) | |
| H01L 21/265 | (2006.01) | |
| H01L 27/115 | (2006.01) | |
| H01L 29/792 | (2006.01) | |

(52) U.S. Cl.
CPC .... *H01L 29/66833* (2013.01); *H01L 21/26506* (2013.01); *H01L 27/115* (2013.01); *H01L 27/11568* (2013.01); *H01L 29/792* (2013.01)

(58) Field of Classification Search
CPC ................ H01L 29/792; H01L 29/66833
USPC .............. 257/314–326, 296, E21.423
See application file for complete search history.

(56) References Cited

U.S. PATENT DOCUMENTS

| | | | |
|---|---|---|---|
| 6,005,285 A | | 12/1999 | Gardner |
| 6,221,724 B1 * | | 4/2001 | Yu et al. ................... 438/289 |
| 6,246,091 B1 * | | 6/2001 | Rodder .................... 257/335 |
| 6,624,037 B2 | | 9/2003 | Buynoski et al. |
| 6,639,271 B1 * | | 10/2003 | Zheng et al. ............. 257/324 |
| 6,864,523 B2 | | 3/2005 | Chen |
| 7,288,828 B2 * | | 10/2007 | Lin et al. .................. 257/586 |
| 2005/0006694 A1 * | | 1/2005 | Liu ........................... 257/315 |
| 2006/0186456 A1 | | 8/2006 | Burnett et al. |
| 2006/0244076 A1 | | 11/2006 | Hamamoto |

FOREIGN PATENT DOCUMENTS

JP     57 177537 A     11/1982

OTHER PUBLICATIONS

PCT Search Report for PCT/US2007/086286 mailed on Apr. 25, 2008.
Written Opinion of the International Searching Authority for International Application No. PCT/US2007/086286 dated Apr. 25, 2008; 4 pages.

* cited by examiner

*Primary Examiner* — Amar Movva

(57) ABSTRACT

One embodiment of the present invention relates to a memory cell. The memory cell comprises a substrate and a stacked gate structure disposed on the substrate, wherein the stacked gate structure comprises a charge trapping dielectric layer that is adapted to store at least one bit of data. The memory cell further includes a source and drain in the substrate, wherein the source and drain are disposed at opposite sides of the stacked gate structure. A barrier region is disposed substantially beneath the source or the drain and comprises an inert species. Other embodiments are also disclosed.

14 Claims, 14 Drawing Sheets

BARRIER REGION UNDERLYING SOURCE/DRAIN REGIONS FOR DUAL-BIT MEMORY DEVICES

FIELD OF INVENTION

The present invention relates generally to memory devices and, in particular, to fabricating dual bit memory devices by providing a barrier region beneath a bitline of the memory cell, thus improving the properties of the devices.

BACKGROUND OF THE INVENTION

Many different types of memory exist to store data for computers and similar type systems. Each type of memory has its own particular advantages and disadvantages. For example, DRAM and SRAM allow individual bits of data to be erased one at a time, but these types of memory lose their data when power is removed. EEPROM can be easily erased without extra exterior equipment, but has reduced data storage density, lower speed, and higher cost. In contrast, EPROM is less expensive and has greater density but lacks erasability.

Flash memory has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc., as well as in many larger electronic systems, such as cars, planes, industrial control systems, etc. Flash memory is generally constructed of many memory cells where single bits of data are written to and read from respective memory cells.

Individual memory cells are generally organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The traditional memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multi-layer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

A modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

As devices are scaled down to smaller sizes, many issues can arise (e.g., leakage currents, cross talk, etc.). For example, isolating two bits or charges stored in a charge trapping layer becomes increasingly difficult as the channel length is decreased and the bits are brought closer together. In this manner, the bits can contaminate one another and operations performed on one bit can affect the other bit (sometimes referred to complimentary bit disturb or CBD). Accordingly, it is desirable to deter electrical carriers from flowing from one memory cell to an adjacent memory cell, such that CBD can be reduced.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One embodiment of the present invention relates to a memory cell. The memory cell comprises a substrate and a stacked gate structure disposed on the substrate, wherein the stacked gate structure comprises a charge trapping dielectric layer that is adapted to store at least one bit of data. The memory cell further includes a source and drain in the substrate, wherein the source and drain are disposed at opposite sides of the stacked gate structure. A barrier region is disposed substantially beneath the source or the drain and comprises an inert species. Other embodiments are also disclosed.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1A:
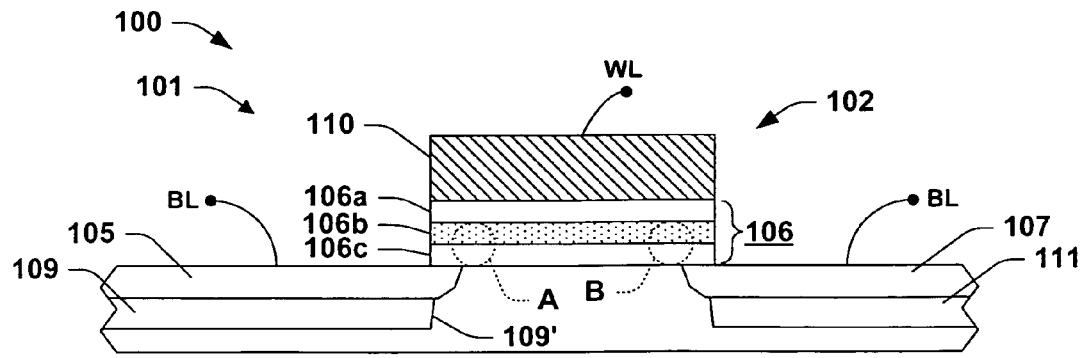
FIGS. 1A-1C are cross-sectional illustrations of a portion of a dual bit flash memory cell.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

Figure 1B:
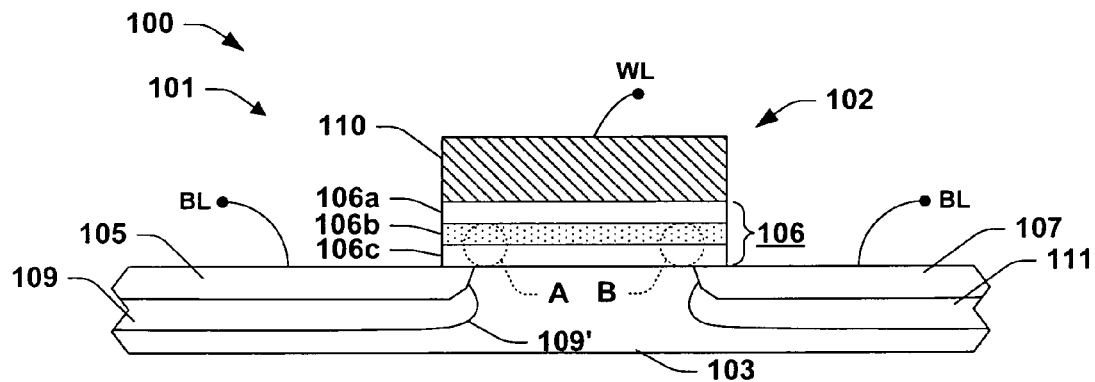
Figure 1C:
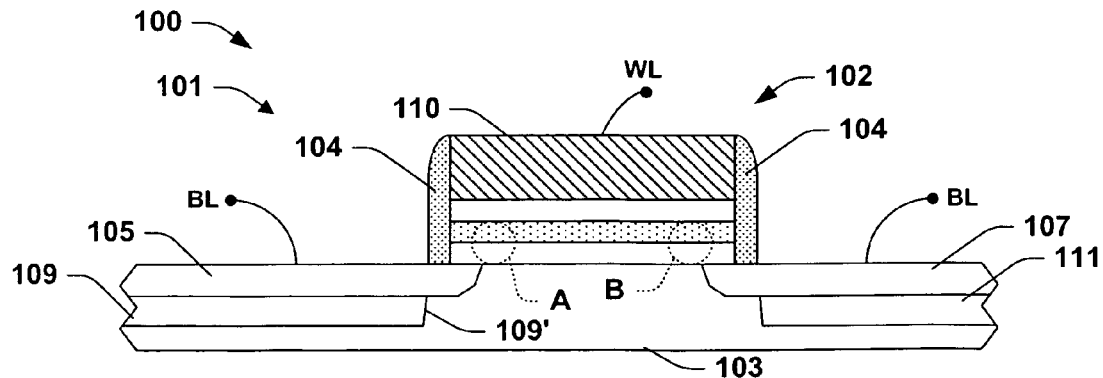

One illustrative memory device 100 is illustrated and described hereinafter with respect to FIGS. 1 and 21-23, where the device 100 can be a dedicated memory device or other type of data processing device (e.g., microprocessor, logic device, etc.) in which a flash memory array is included. FIGS. 1A-1C illustrate exemplary dual-bit flash memory cells 101 of the device 100 in association with which one or more of the various aspects of the invention may be carried out. In FIG. 1A, the memory cell 101 comprises, for example, gate stacked structure 102 that comprises a charge trapping dielectric layer 106, which is adapted to store at least one bit of data. The illustrated charge trapping dielectric layer 106 includes a silicon nitride layer 106b that may have buried polysilicon islands (not shown) therein. The silicon nitride 106b is sandwiched between two $SiO_2$ layers 106a and 106c. Alternatively, the layer 106b may comprise any other form of charge trapping layer, including single or multiple material layers. A p-type silicon substrate 103 has buried n+ source 105 and n+ drain 107 regions that operate as bitlines in the memory array. Beneath the buried source 105 and drain 107 regions are barrier regions 109, 111, respectively. In one embodiment, the barrier regions 109, 111 comprise an inert species (e.g., He, Ne, Ar, Kr, Xe), which forms a defect layer that acts as a recombination center and which stops electrons from propagating between adjacent memory cells. Other inert species could also be used.

Overlying the oxide layer 106c is a doped polysilicon control gate 110 that extends along an array row to other cells (not shown) to form a conductive wordline. The control gate 110 is doped with one more n-type impurities (e.g., phosphorus, arsenic, antimony, etc.) thereby rendering the wordline/control gate 110 conductive. The exemplary memory cell 101 is capable of storing two binary data bits, including a left bit represented by the dashed circle A and a right bit represented by the dashed circle B in FIG. 1A. The dual-bit memory cell 101 is generally symmetrical, wherein the drain 107 and the source 105 are interchangeable. In this regard, the left bitline 105 may serve as the source terminal and the right bitline 107 as the drain terminal with respect to the right bit B. Likewise, the right bitline 107 may serve as the source terminal and the left bitline 105 as the drain terminal for the left bit A. The present invention may be implemented in association with various types of single or multi-bit memory cell types, including the cell 101 of FIG. 1A as well as others not illustrated. In addition, the invention is applicable to such dual-bit memory devices wherein both bits (e.g., bits A and B of cell 101) are used for data or information storage, as well as those in which only one bit (e.g., bit A of cell 101) of the dual-bit cell is so used.

In various embodiments, the barrier regions 109, 111 could be characterized in a variety of ways, a few of which are set forth below. For example, a barrier region could be characterized by a doping profile that varies over the thickness of the substrate; wherein the doping profile has a non-zero value in the source 109 and the doping profile peaks at a position in the substrate 103 that is below the source 109 or drain 111. In another embodiment, the barrier region 109 could be characterized by a doping profile that is relatively constant over the thickness of the substrate associated with the barrier region.

In various embodiments the barrier regions 109, 111 could be positioned within the memory cell various ways. For example, in FIG. 1A, the barrier region 109 comprises a sidewall 109' that is aligned with the stacked gate structure 102. In another embodiment shown in FIG. 1B, the barrier region 109 comprises a sidewall 109' that extends under the stacked gate structure 102, but which sidewall 109' does not protrude into the channel region of the memory cell. In still another embodiment shown in FIG. 1C, the barrier region 109 comprises a sidewall 109' that is aligned with a spacer 104. Other arrangements are also possible, depending on the particular method employed to manufacture the device 100 or cell 101, and all such arrangements are contemplated as falling within the scope of the present invention.

Figure 2:
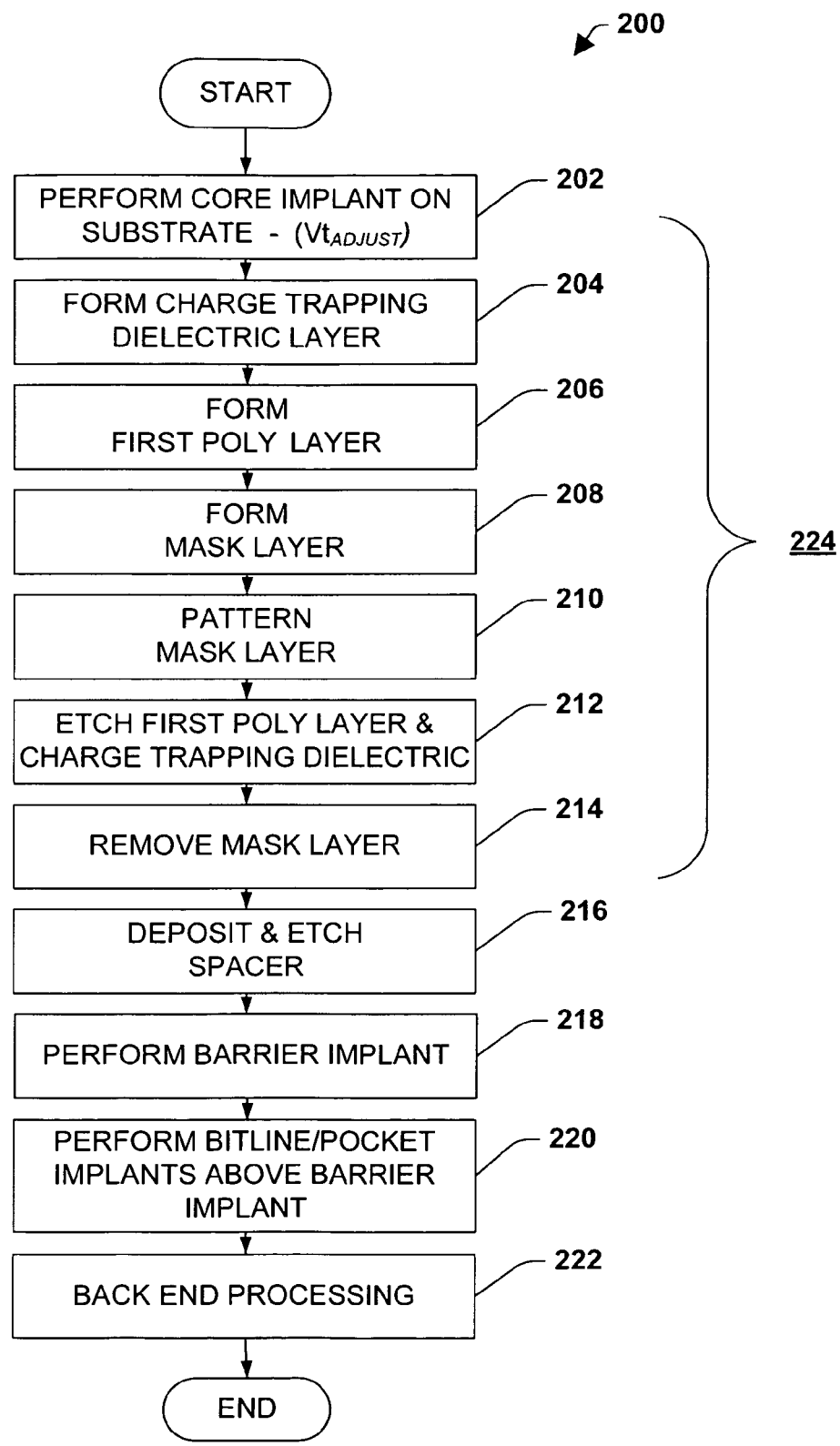
FIG. 2 is a flow diagram illustrating an example of a methodology for forming a memory device in accordance with one or more aspects of the present invention.

Turning to FIG. 2, a methodology 200 is illustrated for forming a memory device according to one or more aspects of the present invention. In particular, the memory is formed with a barrier region 109 substantially beneath the buried source and drain regions, which barrier region acts as a recombination center and can, for example, limit complimentary bit disturb, lessen punch through currents, diminish cross-talk, mitigate Vt roll-off and facilitate increased packing density. The memory device so formed may, for example, correspond to a portion of a memory core such as may include at least part of one of the M by N array cores depicted in FIGS. 21-22.

Although the methodology 200 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 3-20, as well as to devices not shown or described herein.

In the method 200 at 202, a threshold adjustment core implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory cell.

At 204 a charge trapping dielectric layer is formed over the semiconductor substrate. The charge trapping dielectric layer may be a multilayer material that may include a first insulating layer, a charge-trapping layer, and a second insulating layer. The first and second insulating layers may be formed of an oxide dielectric such as silicon dioxide ($SiO_2$), for example. The charge-trapping layer may be formed of a nitride dielectric such as silicon nitride ($Si_xN_y$), for example, and may be formed to a thickness between about 60 to 80 Angstroms, for example. The oxide-nitride-oxide configuration is commonly referred to as an ONO layer for convenience. Alternatively, poly-islands or other types of charge trapping dielectrics may be formed in accordance with one or more aspects of the present invention.

A first layer of poly (polysilicon) based material(s) is then formed over the charge trapping dielectric layer at 206. A mask layer is subsequently formed over the first poly layer at 208. The mask layer may include, for example, photoresist. In one embodiment, an optional antireflective coating (ARC) layer can also be formed over the mask layer. The ARC layer in particular can assist with mitigating reflection during exposure and thereby improves the fidelity of pattern transfer.

The mask layer is then patterned at 210 (e.g., after both the resist and optional ARC layers have been patterned, exposed, etched and/or selectively stripped to form a combined photomask for transferring the pattern onto the mask layer). The patterned features formed (e.g., etched) within the mask layer correspond, at least partially, to buried bitlines which will be formed within the substrate. More particularly, respective spacings between the features correspond somewhat to buried bitlines that will be implanted within the substrate. The spacings within the mask layer can be formed to have respective widths of between about 100 to 140 nanometers, for example.

At step 212 the first poly layer is then plasma etched forming spacings within the first poly layer that have respective widths corresponding somewhat to that of the bitline openings. The plasma etch is an anisotropic process and in this case it etches in the vertical direction only. This degree of accuracy is not possible with photolithography wherein light diffraction limits the process. In other embodiments, a wet (isotrophic) etch could be used, although because such etches generally etch equally in all directions, they are generally not as accurate as the plasma etch employed herein. The charge trapping dielectric layer is similarly plasma etched at step 212 to include spacings having respective widths corresponding to that of the bitline openings. The charge trapping dielectric layer (e.g., ONO) is etched away to expose the silicon for a high energy implant utilizing, for example, arsenic. Without etching the ONO layer the arsenic would have to be implanted at a high energy through the ONO layer, which can cause damage in the ONO layer. This could negatively impact the breakdown voltage and reduce it to a level that would necessitate repairing the ONO layer, for example.

Should some traces of the mask layer features remain after the etching process, these mask layer feature can be stripped or washed away at 214 or at a later appropriate time.

At 216 a spacer material can be deposited over the stacked gate structure and the substrate in various embodiments. This spacer material can then be etched to leave spacer material along both sides of the stacked gate structure. It is also to be appreciated that steps 202 through 216 can be carried out in a variety of ways and can be referred to jointly as a process for forming a stacked gate structure 224.

At 218, an inert barrier implant is formed. In one embodiment, the inert barrier implant comprises implanting an inert species into the substrate. By implanting this inert species, a defect layer can be formed, which defect layer acts as a recombination center for electrical carriers (e.g., electrons or holes) and deters such carriers from propagating and disturbing an adjacent memory cell. In one embodiment, for example, Xenon could be implanted at implantation energy of about 60 KeV to about 130 Kev. In various embodiments, the doping concentration may range from about 1E14 to about 1E15 $cm^{-3}$. It will be appreciated, however, that these numerical values are not limited, but rather the present invention extends to any implantation energy and any doping concentration.

Bitline implants and pocket implants are then performed at 220 to establish the buried bitlines within the exposed semiconductor substrate. The bitline implant can include an n-type dopant, such as arsenic, for example. Accordingly, the bitlines are formed to a width corresponding substantially to that of the bitline openings.

The methodology 200 advances to 222, and ends thereafter, wherein further back end processing can be performed at 222, such as the formation and/or patterning of one or more additional conductive and/or non-conductive layers and/or implantations. For example, at step 222 of method 200 a high temperature oxide deposition can then performed to fill in the respective spacings formed within the charge trapping dielectric layer. The high temperature oxide deposition causes oxide growth over the respective bitlines while also depositing oxide over the buried bitlines.

Still at step 222 a high density plasma (HDP) deposition can then performed to fill in the respective spacings formed within the first poly layer with an oxide material. The entire wafer can then subjected to chemical mechanical polishing (CMP) at 222 to remove any excess oxide and planarize the surface of the structures thereon.

A second layer of poly based material(s) can then be formed over the first poly layer. The second poly layer serves as a wordline material and as such can be patterned into wordlines. Accordingly, the second poly layer can be patterned to establish wordlines over the buried bitlines (e.g., at a substantially 90 degree orientation). It is to be appreciated by one skilled in the art that the back end processing can be carried out in many ways or variations.

Turning now to FIGS. 3-20, an exemplary technique for forming a memory device 100 according to one or more aspects of the present invention is disclosed. In particular, the memory 100 is formed utilizing dual poly layers and oxide applications to deter electrical carriers from propagating and disturbing adjacent memory cells. The memory device 100 so formed may, for example, correspond to a portion of a memory core such as may include at least part of one of the M by N array cores depicted in FIG. 21.

Figure 3:
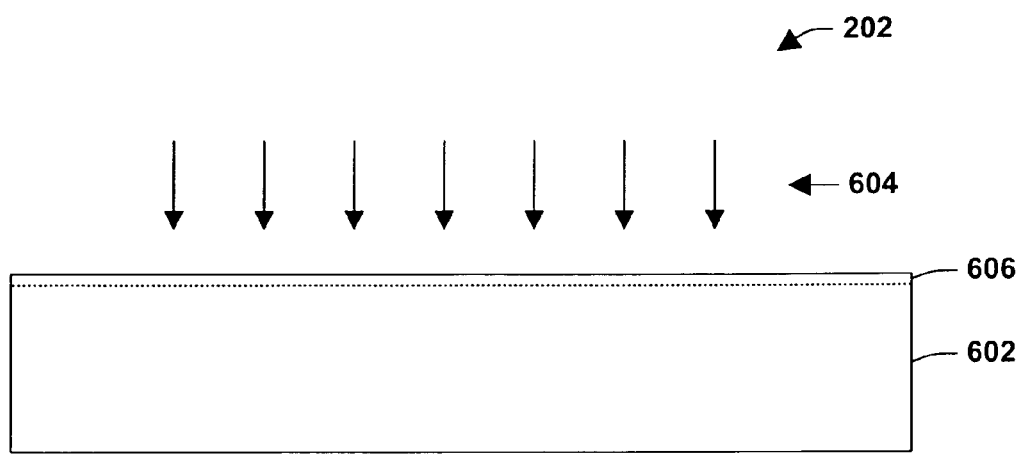
FIGS. 3-20 are cross-sectional illustrations of process steps as a memory device is formed according to one or more aspects of the present invention.

In FIG. 3, a semiconductor substrate 602 upon which the memory is formed is subjected to a threshold adjustment core implantation 604 to establish a region 606 of the substrate 602 that is more heavily doped than the remainder of the semiconductor substrate. The substrate may itself be doped with a p-type dopant such as boron, for example, and the threshold adjustment implant ($V_{tadjust}$) may include a greater concentration of and/or a higher energy implant of the same or different p-type dopant, for example. The threshold adjustment core implantation 604 assists in controlling a threshold voltage of the memory device 100. The threshold adjustment core implantation 604, however, is optional and may be skipped in accordance with the present invention, for example.

It is to be appreciated that reference to substrate 602 or semiconductor substrate 602 as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 4:
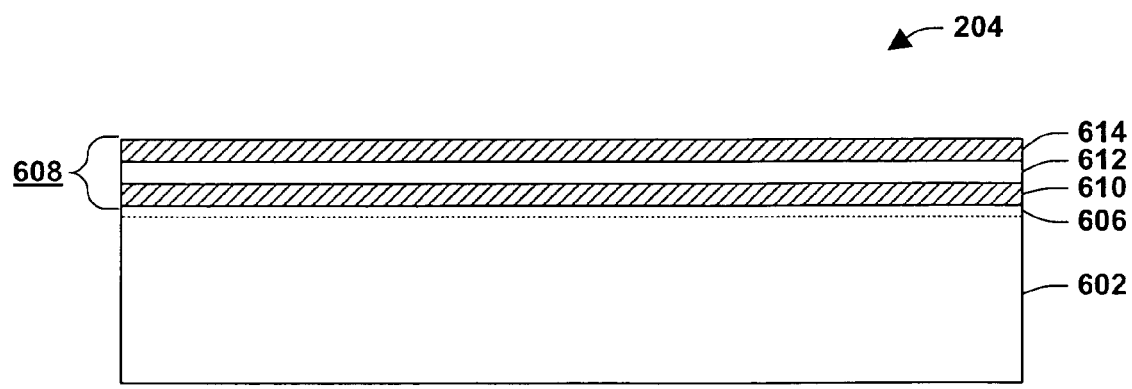

In FIG. 4, a charge trapping dielectric layer 608 is then formed over the semiconductor substrate 602. In the example shown, the charge trapping dielectric layer 608 includes a first insulating layer 610, a charge trapping layer 612 and a second insulating layer 614. The first and second insulating layers, 610 and 614 respectively, can include, for example, silicon dioxide. The charge-trapping layer 612 may be formed of a nitride dielectric such as silicon nitride ($Si_xN_y$), for example. The oxide-nitride-oxide configuration is commonly referred to as an ONO layer for convenience. Alternatively, poly-islands or other types of charge trapping dielectrics may be formed in accordance with one or more aspects of the present invention.

Figure 5:
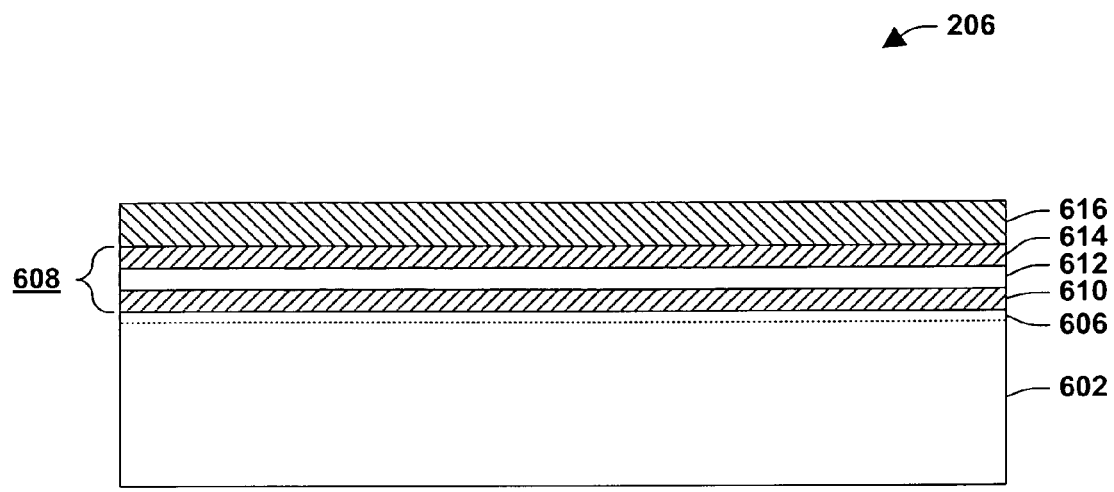
Figure 6:
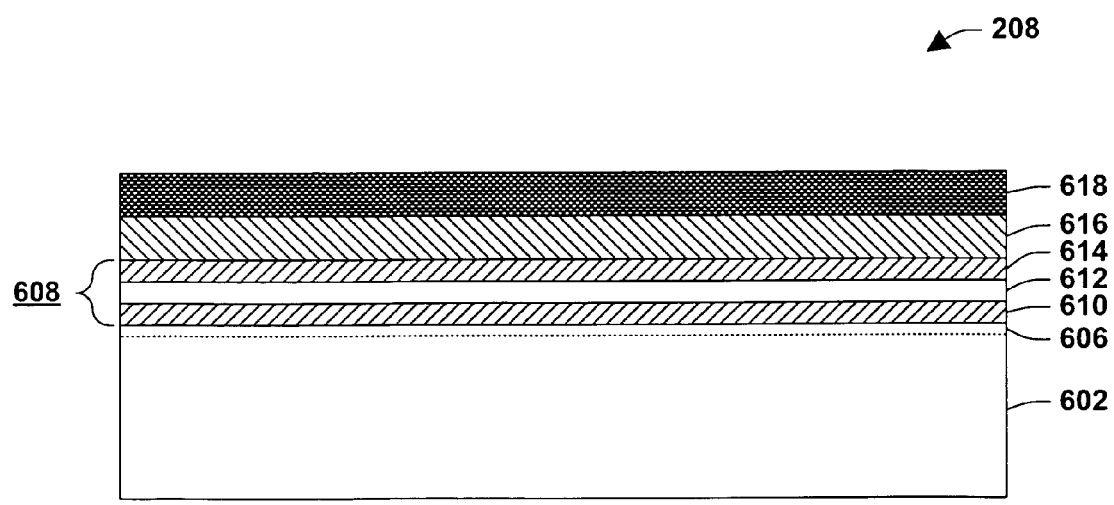

In FIG. 5, a first poly layer of polysilicon based material(s) 616 is then formed over the charge trapping dielectric layer 608. In FIG. 6, a mask layer 618 such as a resist layer is subsequently formed over the first poly layer 616. An optional antireflective coating (ARC) layer (not shown), that may include an organic material, such as silicon nitride or silicon oxynitride, for example, can be formed over the mask layer 618. The ARC layer in particular assists with mitigating reflection during exposure and thereby improves the fidelity of pattern transfer.

Figure 7:
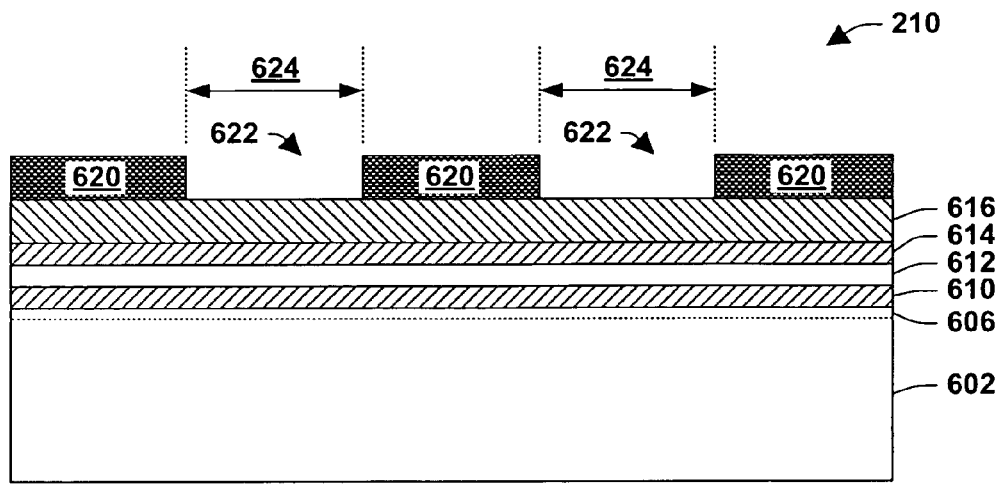

In FIG. 7, the mask layer 618 is then patterned. The resulting mask layer features 620 formed from the mask layer 618 relate, at least partially, to buried bitlines which will be formed within the substrate 602. More particularly, respective first spacings 622 between the features 620 relate to buried bitlines that will be implanted within the substrate 602. The first spacings 622 within the mask layer 618 can be formed to have respective first widths 624.

Figure 8:
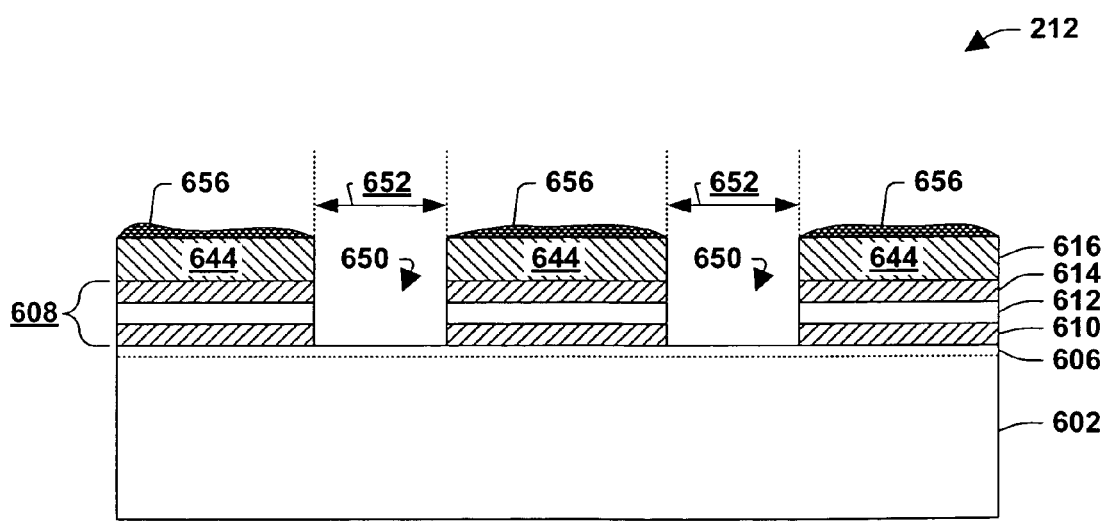
Figure 9:
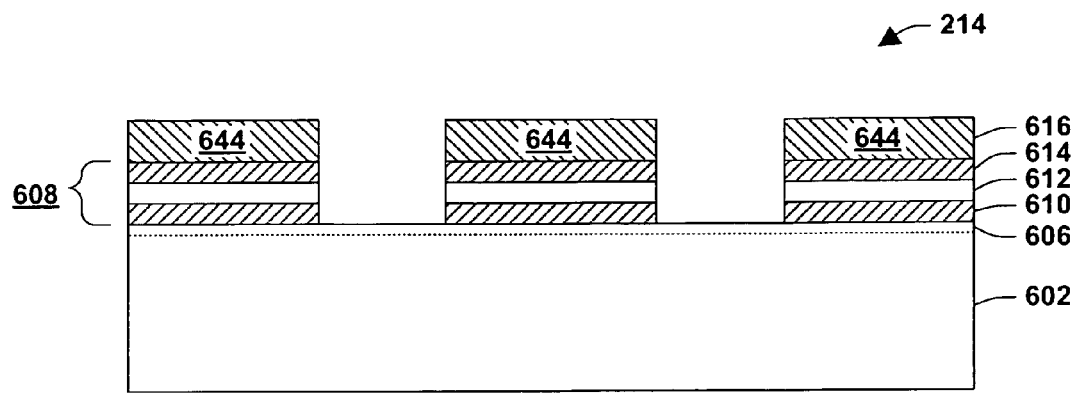

In FIG. 8, the first poly layer 616 is then patterned to form third spacings 650 within the first poly layer 616, which spacings have respective second widths 652 corresponding to the first widths 624 of the bitline openings 634 (FIG. 7). The charge trapping dielectric layer 608 is similarly patterned to include third spacings having respective third widths also corresponding to that second widths 652 of the second spacings 650. The etchants utilized to remove the first 610 and second 614 dielectric layers could also be effective to remove the patterned mask layer features 620. Should some traces 656 of the mask layer features remain, these can be stripped or washed away at a later time to reveal a clean patterned first poly layer 616, as shown in FIG. 9.

Figure 10:
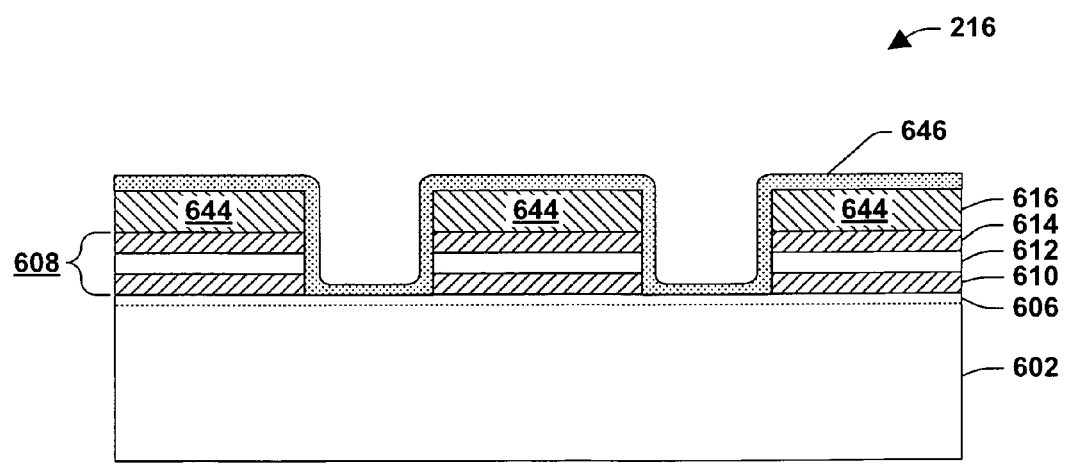
Figure 11:
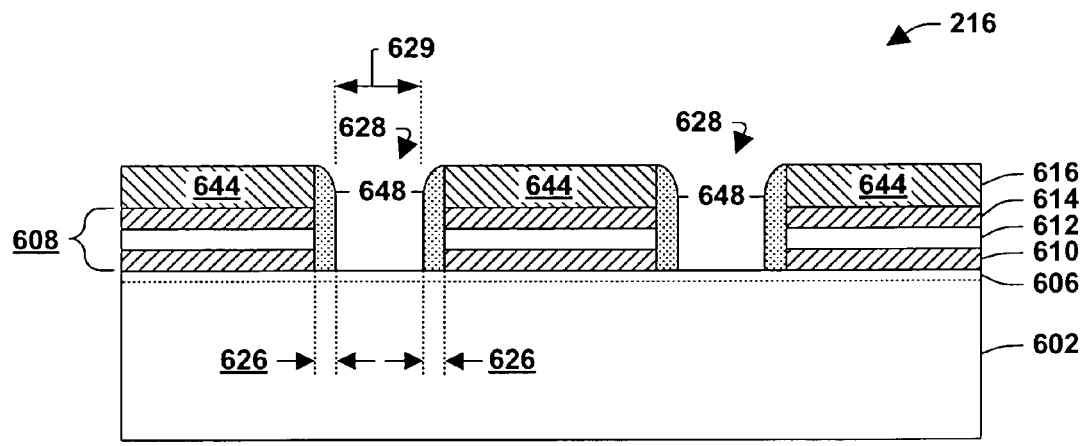

In FIG. 10, a spacer material 646 (e.g., of oxide and/or nitride based material) is then formed over the patterned ONO features and exposed patterned portions or features of the first poly layer 644. As such, in one embodiment, the spacer material 646 is then patterned (e.g., isotropically plasma etched) to form sidewall spacers 648 adjacent to the patterned features of the ONO layer and patterned first poly layer 644, as shown in FIG. 11. The distance between the sidewall spacers 648 defines respective fifth spacings 628 having fourth widths 629.

Figure 12:
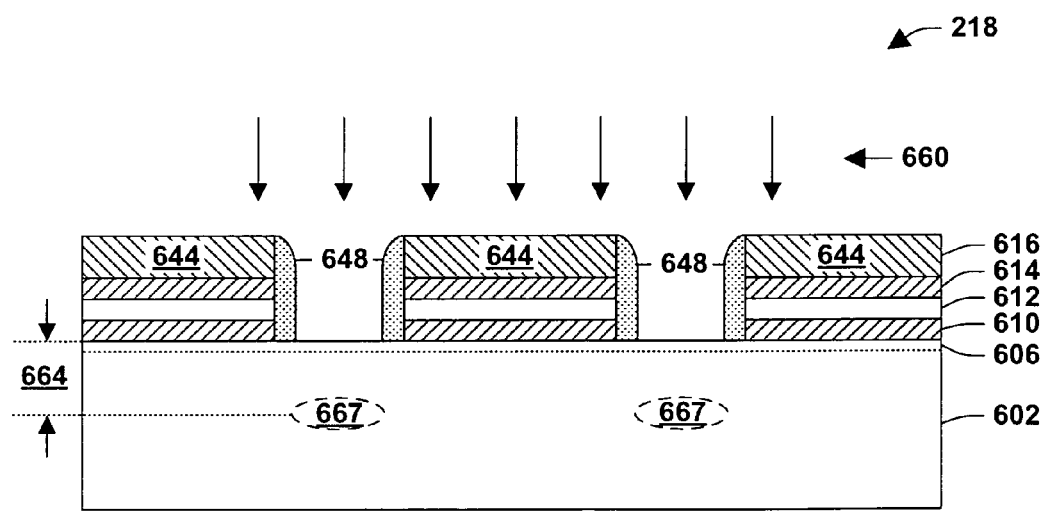

In FIG. 12, an inert barrier implant 660 is performed to form a barrier region 667 in a manner that the barrier region will be beneath the buried bitlines (e.g., source and/or drain). In one embodiment, the inert barrier implant comprises implanting an inert species into the substrate as previously discussed. In one embodiment, the barrier region 667 can be characterized by a doping profile that that varies over the thickness of the substrate associated with the barrier region. In one embodiment, the doping profile could peak at a depth 664 located below the top surface of the substrate. This doping profile could be constant, Gaussian, exponential, or represented by any other linear or non-linear function over the thickness of the substrate, including functions that are discontinuous. In other embodiments, the doping profile could peak at a depth located below the buried bitline, at the bottom edge of the buried bitline, or elsewhere within the buried bitline.

Figure 13:
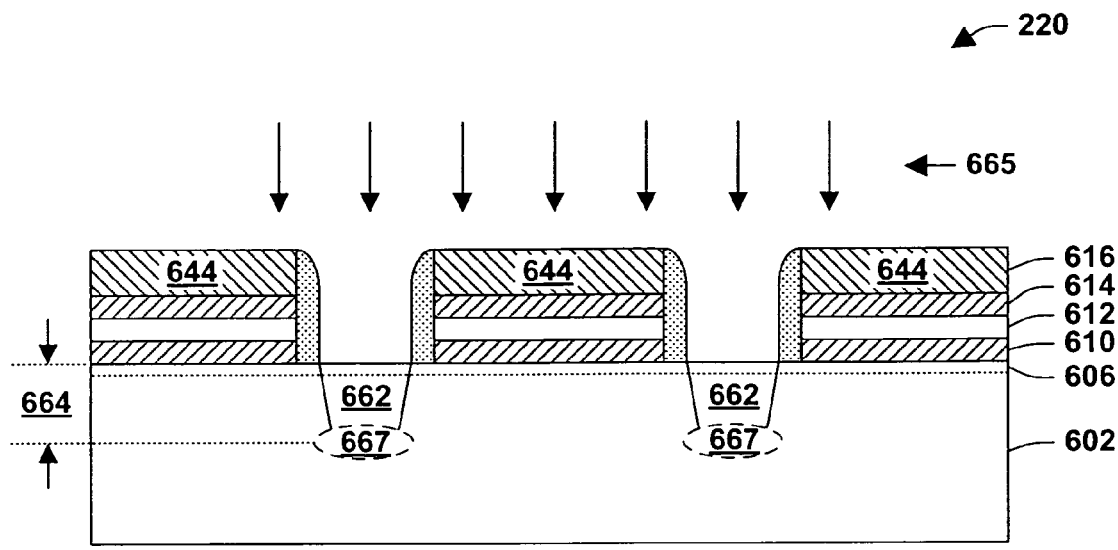

In FIG. 13, a bitline implant 665 is then performed to establish the buried bitlines 662 within the semiconductor substrate 602. The bitline implant 665 can include an n-type dopant, such as arsenic, for example.

Figure 14:
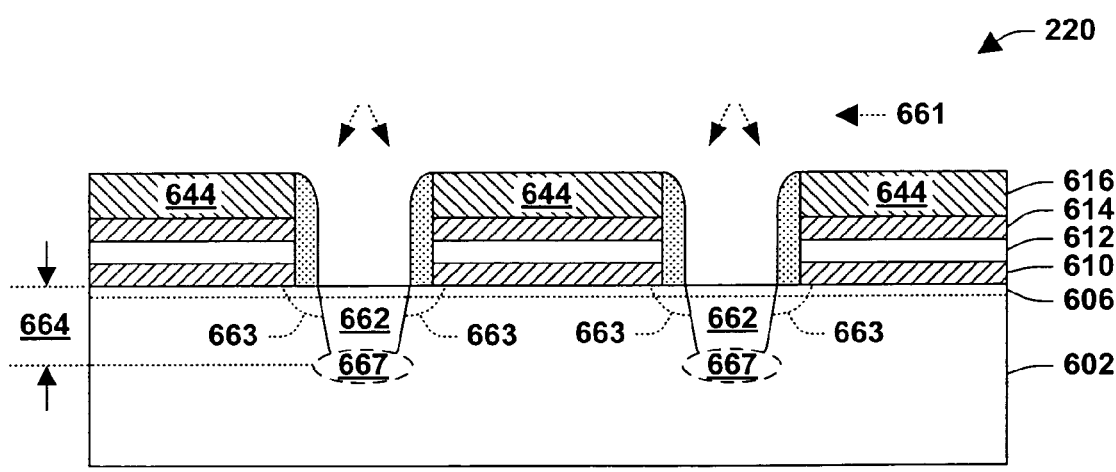

In FIG. 14, a pocket implant 661 can be performed into the bulk substrate 602 to form pocket regions 663. The pocket implant 661 can increase the device threshold Vt and roll off short channel effect. It should be appreciated by one skilled in the art that the optional pocket implant 661 can be done before the spacers 648 are created so that the bitline implant 600 and the pocket implant 661 are offset, for example. The sidewall spacers 648 can be, for example, damaged by the high dose bitline implant 660 can be removed leaving sixth spacings (not shown) leaving a bitline to edge gap between the edge of the ONO layer and the edge of the bitline.

Figure 15:
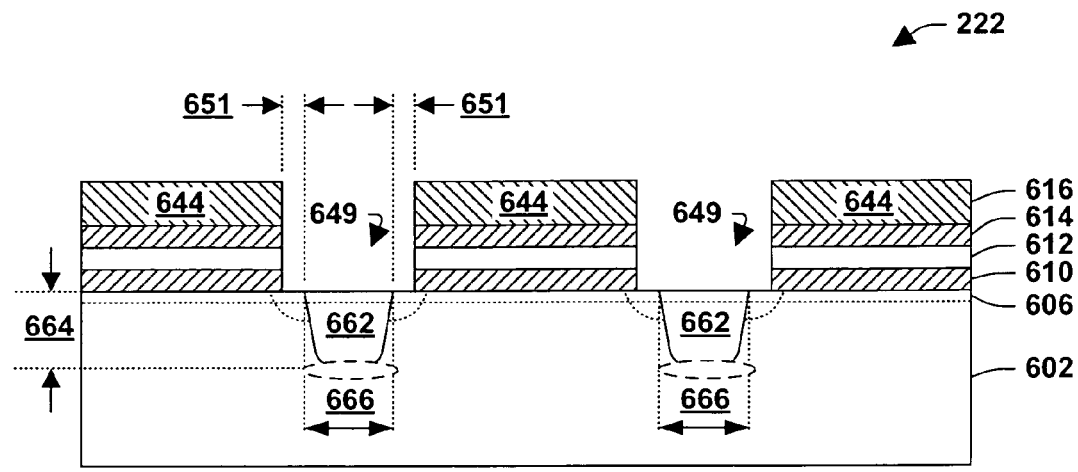

In FIG. 15, the spacer material, which could have been damaged by the various implants, can be removed leaving sixth spacings 649 and leaving a bitline to edge gap 651 between the edge of the ONO layer and the edge of the bitline as shown.

Figure 16:
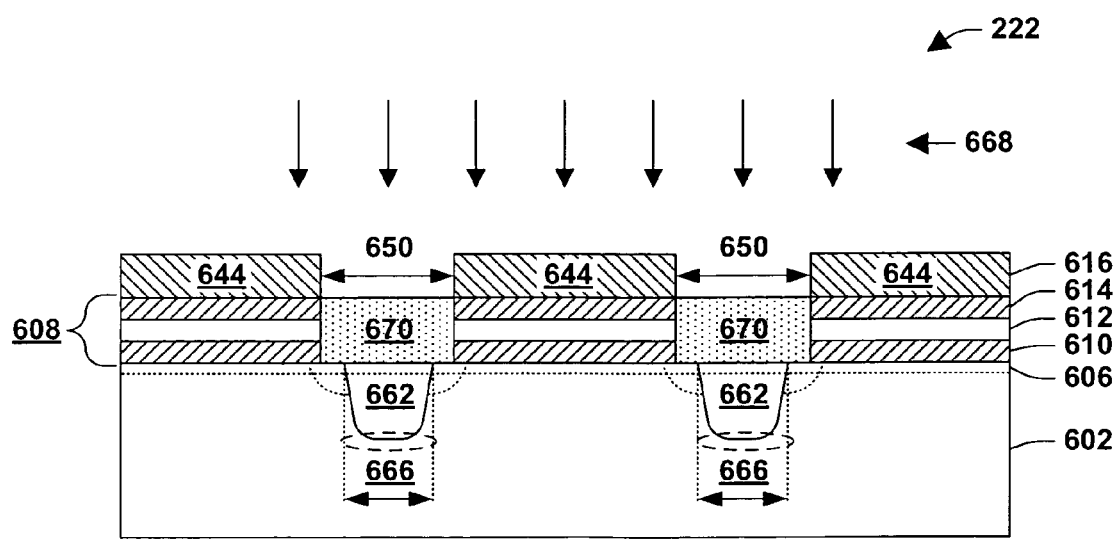

In FIG. 16, a high temperature oxide deposition 668 can then performed to fill the respective sixth spacings 649 formed within the charge trapping dielectric layer 608 with an oxide based material 670. The high temperature oxide deposition causes oxide growth over the respective bitlines 662 while also depositing oxide over the exposed poly features 644.

Figure 17:
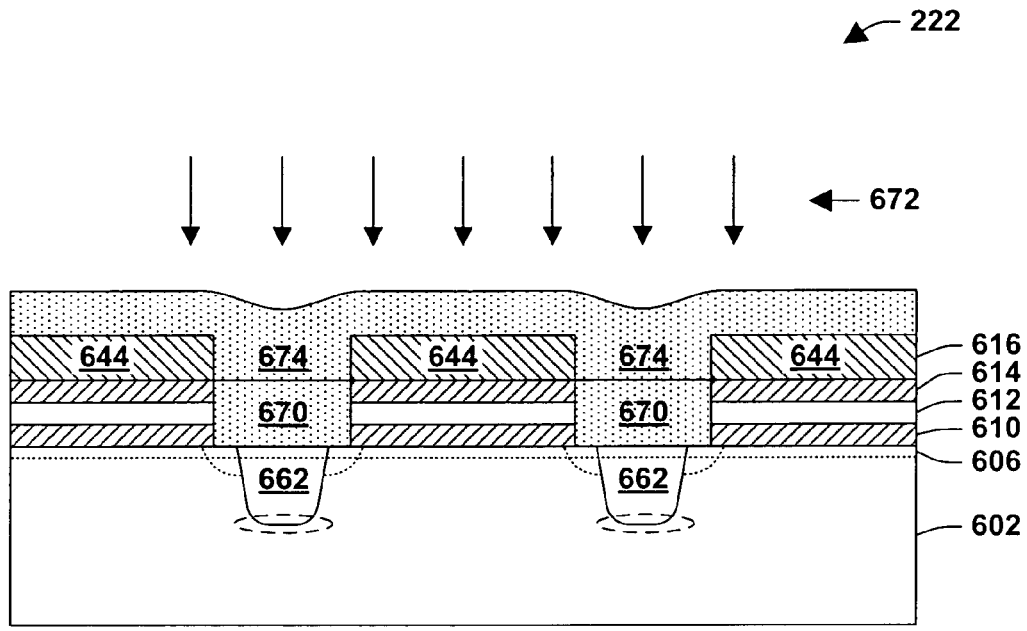
Figure 18:
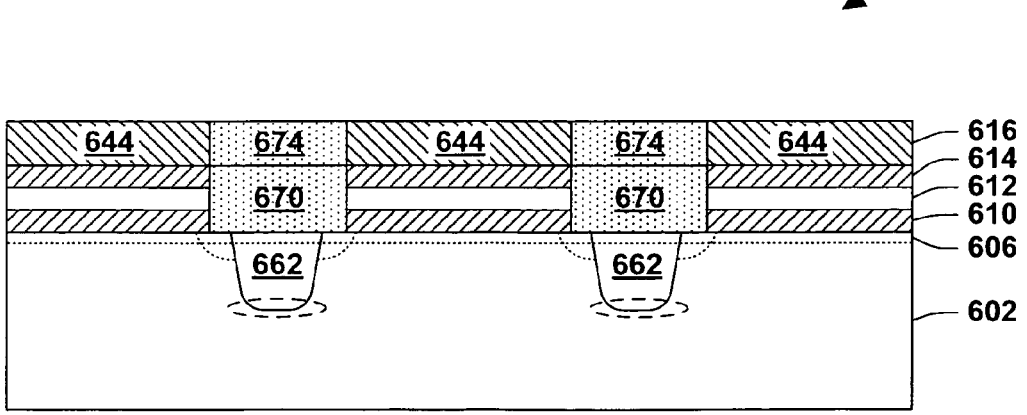

In FIG. 17, a high density plasma (HDP) deposition 672 is then performed to fill the openings within the memory device 100 formed within the first poly layer 616 with an oxide material 674. The entire wafer is then subjected to chemical mechanical polishing (CMP) to remove any excess oxide material 674 and planarize the surface of the structures thereon (FIG. 18).

Figure 19:
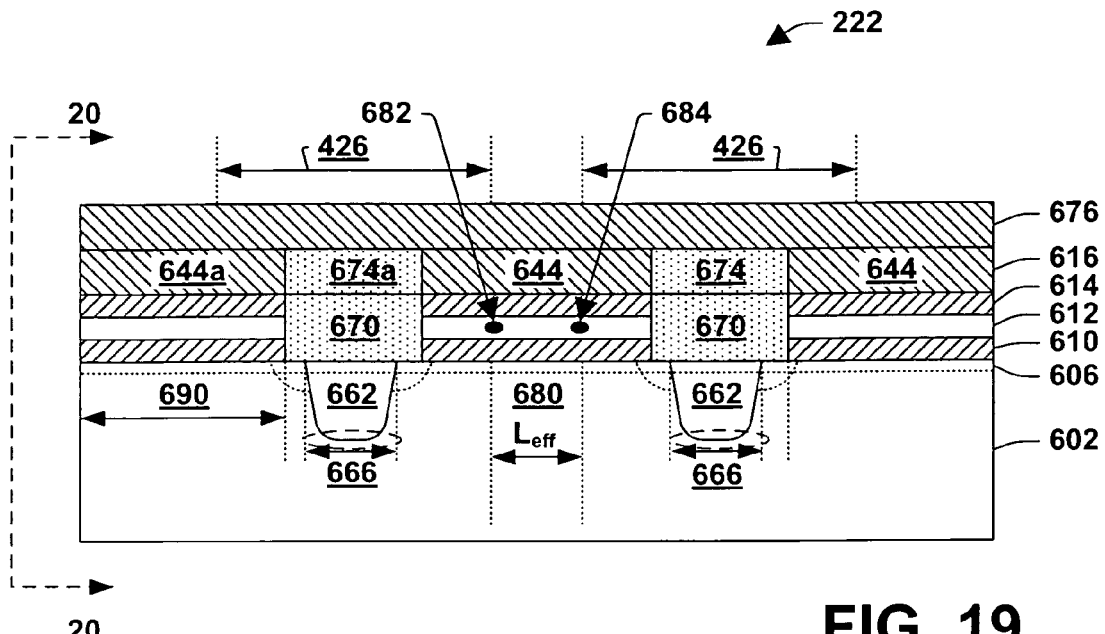
Figure 20:
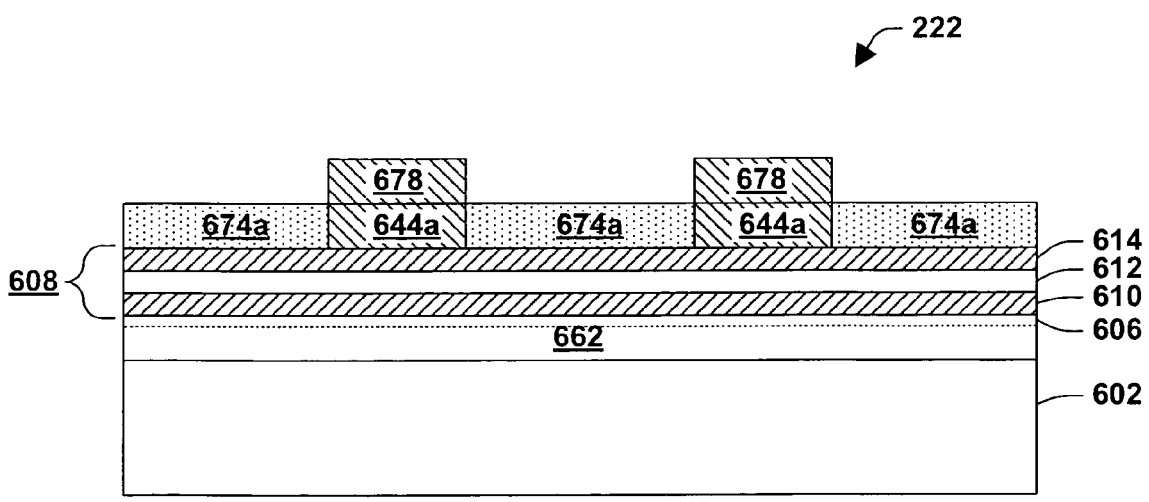

In FIG. 20, a second layer of poly based material(s) 676 can then be formed over the first poly layer 616, for example. The second poly layer 676 serves as a wordline material and as such can be patterned into wordlines. Accordingly, the second poly layer 676 is then patterned to establish wordlines 678 over the buried bitlines 662 (FIG. 20). It will be appreciated that the wordlines 678 are formed so as to be oriented at approximately 90 degrees relative to the bitlines 662. This "crossed" orientation allows individual memory cells to be addressed. The illustration depicted in FIG. 20 is accordingly rotated approximately 90 degrees relative to the images illustrated in FIGS. 3-19. As such, a side view or view along the length of a buried bitline 662 is illustrated in FIG. 20. FIG. 20 can also be thought of as a view into FIG. 19 along lines 20-20 with the second poly layer 676 patterned into the wordlines 678.

It will be appreciated that since the buried bitlines 662 are substantially parallel to the "strips" 644 of the patterned first poly layer 616 as well as the "strips" 674 of oxide material deposited between strips 644, the patterned wordlines 678 are also substantially perpendicular to strips 644, 674. Accordingly, since the wordlines 678 lie immediately over these strips 644, 674, the wordlines may be shorted together by the underlying strips 644 of the patterned first poly layer 616 if these strips 644 are not patterned so as to electrically isolate the overlying wordlines 678 from one another. As such, when the second poly layer 676 is patterned to form the wordlines 678, this process continues until underlying portions of the strips 644 between the wordlines 678 are also removed (e.g., to expose the second insulating layer 614). Accordingly, the portions of the strip of oxide material 674a visible in FIG. 20 is revealed by the removed portions of the strip 644a of the first poly layer 616. As such, these visible portions of strip 674a are actually set back from the remaining portions of strip 644a by a distance substantially equal to the width 690 of strip 644a (FIG. 19).

Referring to FIG. 19, it will be appreciated that the buried bitlines 662 serve as source and drain regions of the transistor or memory cell 101, and a channel 680 is defined between these regions. The channel 680 underlies a gate of the transistor, where wordlines generally serve as the gates of transistors operating as memory devices. When a voltage of a sufficient magnitude (e.g., a threshold voltage (Vt)) is applied to the gate of the transistor, electric fields generated within the transistor allow currents to flow between the source and drain regions. This allows charges 682, 684 (which correspond to bits of data) to be stored (programmed) within and/or erased from the charge trapping layer 612. It will be appreciated that dual charges or bits are discussed herein as one or more aspects of the present invention have application to dual bit memory cells.

As scaling occurs, however, and channel lengths are correspondingly decreased, the threshold voltage Vt can change. For example, as source and drain regions are brought closer together, smaller and smaller voltages are needed to program and/or erase bits of data. This can promote Vt roll-off and lead to data being unintentionally erased and/or programmed. The narrower bitlines 662, however, serve to mitigate Vt roll-off, thereby providing more predictability as to when data will be programmed and/or erased from the cell 101. Additionally, the oxide regions 670, 674 overlying the bitlines 662 serve to maintain and/or increase a breakdown voltage between the bitlines 662 and the wordlines 678 (e.g., from a more conventional 16V to around 25V). In this manner the transistor exhibits more predictable performance as compared to conventional devices.

It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example. In addition, although reference may have been made to a p-type dopant or an n-type dopant, these dopants may be switched in a suitable manner, as one of ordinary skill in the art will appreciate.

Figure 21:
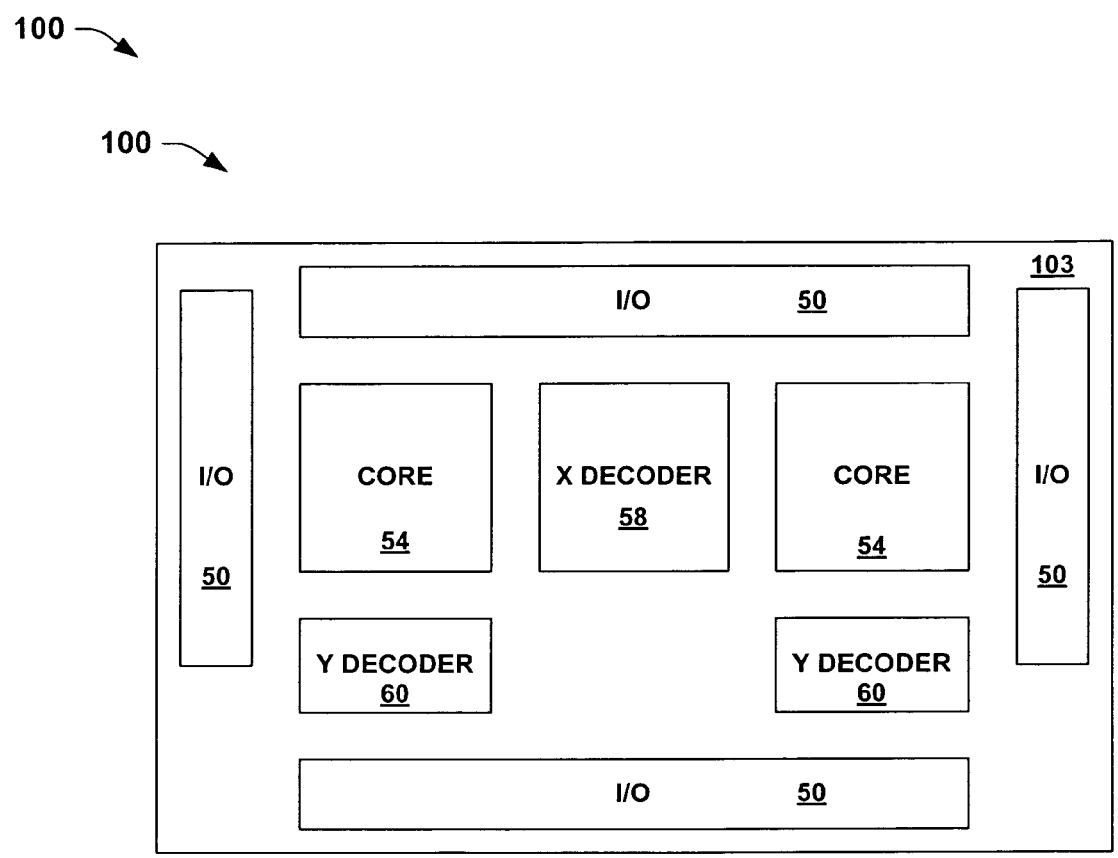
FIG. 21 is a top view of a dual bit flash memory device.

FIG. 21 illustrates a schematic top plan view of an exemplary dedicated memory device 100, comprising a semiconductor substrate 103 in which one or more high-density core regions and one or more low-density peripheral portions are formed. The core regions comprise one or more M×N array cores 54 of individually addressable, substantially identical dual-bit flash memory cells 101, as illustrated in FIGS. 1A-1C. The peripheral portions comprise I/O circuitry 50 and programming or decoder circuitry 58, 60 for selectively addressing the individual memory cells 101. The programming circuitry comprises one or more x-direction (e.g., column) decoders 58 and y-direction (e.g., row) decoders 60, which, together with the I/O circuitry 50, connect the source, gate, and drain (e.g., wordlines and bitlines) of selected addressed memory cells 101 to predetermined voltages or impedances during program, erase, and read operations. In this regard, the decoder and I/O circuitry provide the necessary wordline and bitline control signals during memory access operations, and buffer the incoming and outgoing data associated therewith, wherein the circuits 50, 58, and 60 may be fashioned from any suitable logic circuits and devices within the scope of the invention.

Figure 22:
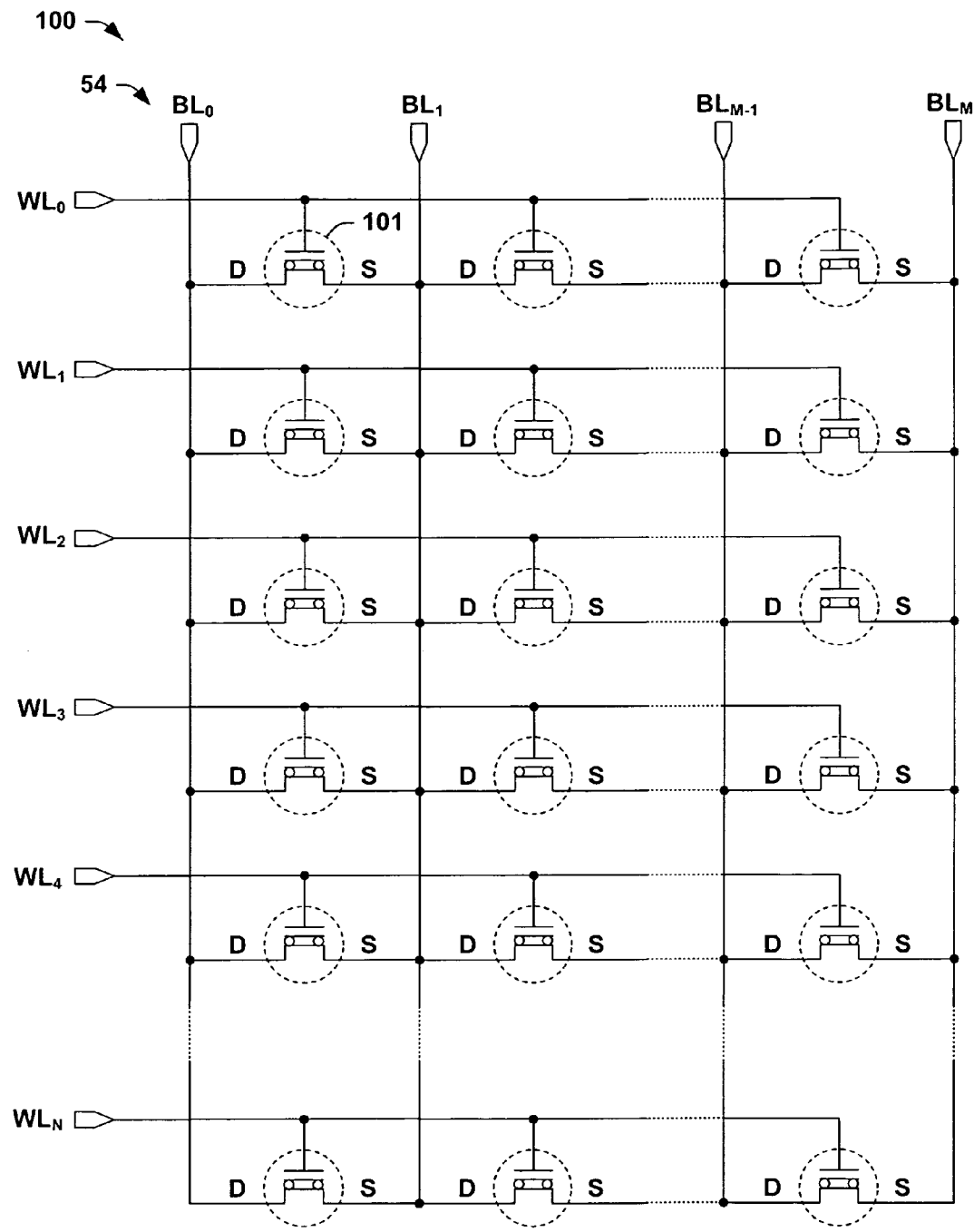
FIG. 22 is a schematic illustration of a portion of a memory device which may include at least part of one of the memory core depicted in FIG. 21.

FIG. 22 illustrates a portion of one of the core arrays 54 in the device 100, wherein portions of several rows and columns of cells 101 are illustrated along wordlines $WL_0$ through $WL_N$ and bitlines $BL_0$ through $BL_M$, respectively, where the array 54 is illustrated in a virtual ground configuration in this example. The array 54 comprises rows of flash cells 101 with control gate terminals coupled to an associated wordline WL, and with columns of cells 101 having a drain of one cell 101 coupled to an associated bitline BL together with the source of an adjacent cell 101. In this configuration, the drain terminals of the cells 101 within a given column are connected to the same bitline BL. Individual flash cells 101 may be selected via a corresponding wordline WL and a pair of bitlines BL bounding the target cell 101, wherein the wordline and bitline signals are generated by the decoder circuitry 58 (FIG. 3). Thus, when a positive voltage is applied to the bitline BL coupled to the drain of a cell 101, a conductive path is established between the drain and the source thereof, which is coupled to ground by provision of the appropriate bitline signals from the decoders 58. In this manner, a virtual ground is formed by selectively connecting a ground to the bit line associated with the source terminal of only those selected flash cells which are to be programmed or read.

Figure 23:
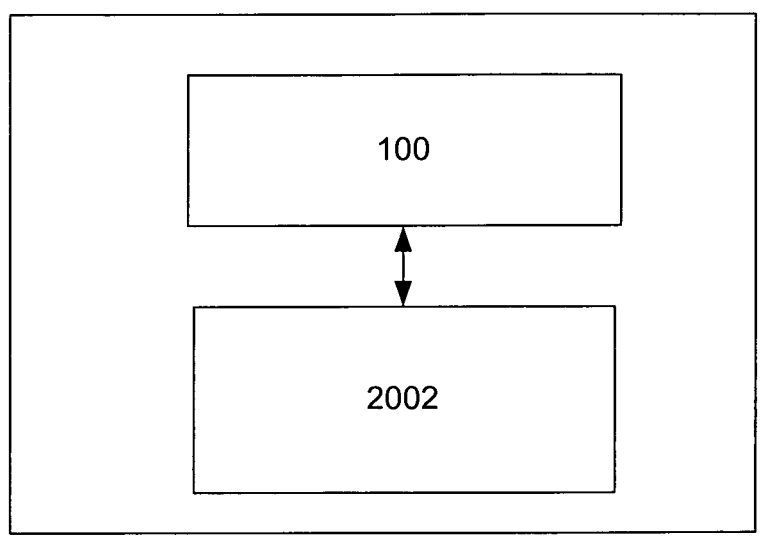
FIG. 23 is a block diagram of a data processing device in which exemplary memory devices may be utilized.

FIG. 23 shows an embodiment of a data processing device 1000 that comprises data processing circuitry 1002 configured to process data; and a memory device 1004 for storing the data. The memory device may be memory device 100 or other memory device as described herein. In one embodiment, the memory device 1004 can include a flash memory array wherein a barrier region is disposed substantially beneath the source or the drain. In one embodiment the processing device 1000 could be a communication device, such as a cell phone or pager, for example. In other embodiments, the processing device 1000 could be a portable electronic product, such as a portable computer, camera, music device, voice recorder, etc. In still other embodiments, the processing device 1000 could comprise an electronic system, such as a car, plane, industrial control system, etc.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A memory cell, comprising:
   a substrate having a thickness;
   a stacked gate structure disposed on the substrate, the stacked gate structure comprising a charge trapping dielectric layer that is adapted to store at least one bit of data;
   a source in the substrate, the source disposed at a side of the stacked gate structure;
   a drain in the substrate, the drain disposed at the other side of the stacked gate structure; and
   a barrier region disposed substantially beneath the source or the drain and comprising at least one of helium, neon, argon, krypton, or xenon,
   wherein the barrier region is characterized by a retrograde doping profile that varies across a vertical thickness of the substrate.

2. The memory cell of claim 1, wherein the barrier region is associated with the source so as to deter electrical carriers from propagating through the substrate between the memory cell and an adjacent memory cell.

3. The memory cell of claim 2, wherein the memory cell is a flash memory cell that is adapted to store at least two bits of data.

4. The memory cell of claim 2, wherein the barrier region comprises a sidewall that is aligned with the stacked gate structure.

5. The memory cell of claim 1, wherein the barrier region comprises a sidewall that extends under the plurality of stacked gate structures.

6. The memory cell of claim 1, wherein the at least one of helium, neon, argon, krypton, or xenon are implanted at a doping concentration of about 1E14 to about 1E15 $cm^{-3}$.

7. The memory cell of claim 1, wherein the at least one of helium, neon, argon, krypton, or xenon are implanted at energies between about 60 keV and about 130 keV.

8. The memory cell of claim 1, wherein the retrograde doping profile has a non-zero value in the source and peaking at a position in the barrier region that is below the source.

9. A nonvolatile memory, comprising:
   a substrate having a thickness;
   a column of memory cells of the nonvolatile memory disposed on the substrate, the column of memory cells comprising a plurality of stacked gate structures disposed on the substrate, each stacked gate structure comprising a change trapping dielectric layer that is adapted to store at least a bit of data;
   a source disposed in the substrate at a side of the row of memory cells;

a drain disposed in the substrate at the other side of the row of memory cells and defining a channel region between the source and drain; and a barrier region, wherein the barrier region comprises at least one of helium, neon, argon, krypton, or xenon, and wherein the barrier region is characterized by a retrograde doping profile that varies across a vertical thickness of the substrate.

10. The nonvolatile memory of claim 9, wherein the barrier region is associated with the drain so as to deter electrical carriers from propagating through the substrate between the memory cell and an adjacent memory cell.

11. The nonvolatile memory of claim 10, wherein the barrier region comprises a side that is aligned with the plurality of stacked gate structures.

12. The nonvolatile memory of claim 9, further comprising:

a poly layer disposed over one of the stacked gate structures, wherein the poly layer is selectively biased to facilitate the storage of the at least one bit of data.

13. The nonvolatile memory of claim 9, wherein the at least one of helium, neon, argon, krypton, or xenon are implanted at a doping concentration of about 1E14 to about 1E15 cm$^{-3}$.

14. The nonvolatile memory of claim 9, wherein the at least one of helium, neon, argon, krypton, or xenon are implanted at energies between about 60 keV and about 130 keV.

* * * * *